United States Patent
Miller et al.

(10) Patent No.: US 7,397,485 B2
(45) Date of Patent: *Jul. 8, 2008

(54) COLOR OLED DISPLAY SYSTEM HAVING IMPROVED PERFORMANCE

(75) Inventors: Michael E. Miller, Honeoye Falls, NY (US); Ronald S. Cok, Rochester, NY (US); Andrew D. Arnold, Hilton, NY (US); Michael J. Murdoch, Rochester, NY (US)

(73) Assignee: Eastman Kodak Company, Rochester, NJ (US)

( * ) Notice: Subject to any disclaimer, the term of this patent is extended or adjusted under 35 U.S.C. 154(b) by 760 days.

This patent is subject to a terminal disclaimer.

(21) Appl. No.: 10/812,629

(22) Filed: Mar. 29, 2004

(65) Prior Publication Data

US 2004/0178974 A1    Sep. 16, 2004

Related U.S. Application Data

(63) Continuation-in-part of application No. 10/320,195, filed on Dec. 16, 2002, now Pat. No. 7,230,594, which is a continuation-in-part of application No. 10/387,953, filed on Mar. 13, 2003, now Pat. No. 7,184,067.

(51) Int. Cl.
*G09G 5/02* (2006.01)
(52) U.S. Cl. .................... 345/696; 345/83; 345/694
(58) Field of Classification Search ................ 345/211, 345/212, 690, 694, 696, 83, 84; 315/169.3
See application file for complete search history.

(56) References Cited

U.S. PATENT DOCUMENTS

| | | | |
|---|---|---|---|
| 3,813,686 A | 5/1974 | Mierwinski | |
| 4,800,375 A | 1/1989 | Silverstein et al. | |
| 5,233,385 A | 8/1993 | Sampsell | |
| 5,526,016 A | 6/1996 | Nakagiri et al. | |
| 5,563,621 A | 10/1996 | Silsby | |
| 5,638,084 A | 6/1997 | Kalt | |

(Continued)

FOREIGN PATENT DOCUMENTS

EP    830032    3/2002

(Continued)

OTHER PUBLICATIONS

Klompenhouwer et al.; "Subpixel Image Scaling For Color Matrix Displays"; SID 02 Digest; pp. 176-179.

*Primary Examiner*—Kent Chang
(74) *Attorney, Agent, or Firm*—Andrew J. Anderson

(57) ABSTRACT

An OLED display system includes a) an OLED display including an array of light emitting pixels, each pixel having a plurality of OLEDs for emitting different colors of light specifying a gamut wherein one of the OLEDs has a power efficiency or lifetime different from the power efficiency or lifetime of at least one of the other OLEDs; b) a control signal; and c) a display driver for receiving a color display signal representing a relative luminance and color to be produced for each pixel of the display and generating a converted color display signal for driving the OLEDs in the display, wherein the display driver is responsive to the control signal for controlling the color gamut saturation of light produced by the OLEDs to reduce power consumption or increase lifetime of at least one of the OLEDs.

24 Claims, 8 Drawing Sheets

U.S. PATENT DOCUMENTS

| | | |
|---|---|---|
| 6,075,514 A | 6/2000 | Ryan |
| 6,133,692 A | 10/2000 | Xu et al. |
| 6,262,710 B1 | 7/2001 | Smith |
| 6,388,644 B1 | 5/2002 | DeZwart et al. |
| 6,411,306 B1 | 6/2002 | Miller et al. |
| 6,483,245 B1 | 11/2002 | Weindorf et al. |
| 6,498,592 B1 | 12/2002 | Matthies |
| 2002/0015110 A1 | 2/2002 | Elliott |
| 2002/0024618 A1 | 2/2002 | Imai |
| 2002/0186214 A1 | 12/2002 | Siwinski |
| 2002/0196208 A1 | 12/2002 | Nano et al. |
| 2003/0103058 A1 | 6/2003 | Elliott et al. |
| 2004/0051724 A1 | 3/2004 | Elliott et al. |
| 2004/0113875 A1 | 6/2004 | Miller et al. |
| 2004/0178743 A1 | 9/2004 | Miller et al. |
| 2004/0178973 A1 | 9/2004 | Miller et al. |
| 2004/0195963 A1 | 10/2004 | Choi et al. |
| 2004/0222999 A1 | 11/2004 | Choi et al. |

FOREIGN PATENT DOCUMENTS

| | | |
|---|---|---|
| JP | 10/254386 | 9/1998 |
| JP | 2000/200061 | 7/2000 |
| WO | 00/11728 | 3/2000 |
| WO | 00/70400 | 11/2000 |
| WO | 01/99195 | 12/2001 |

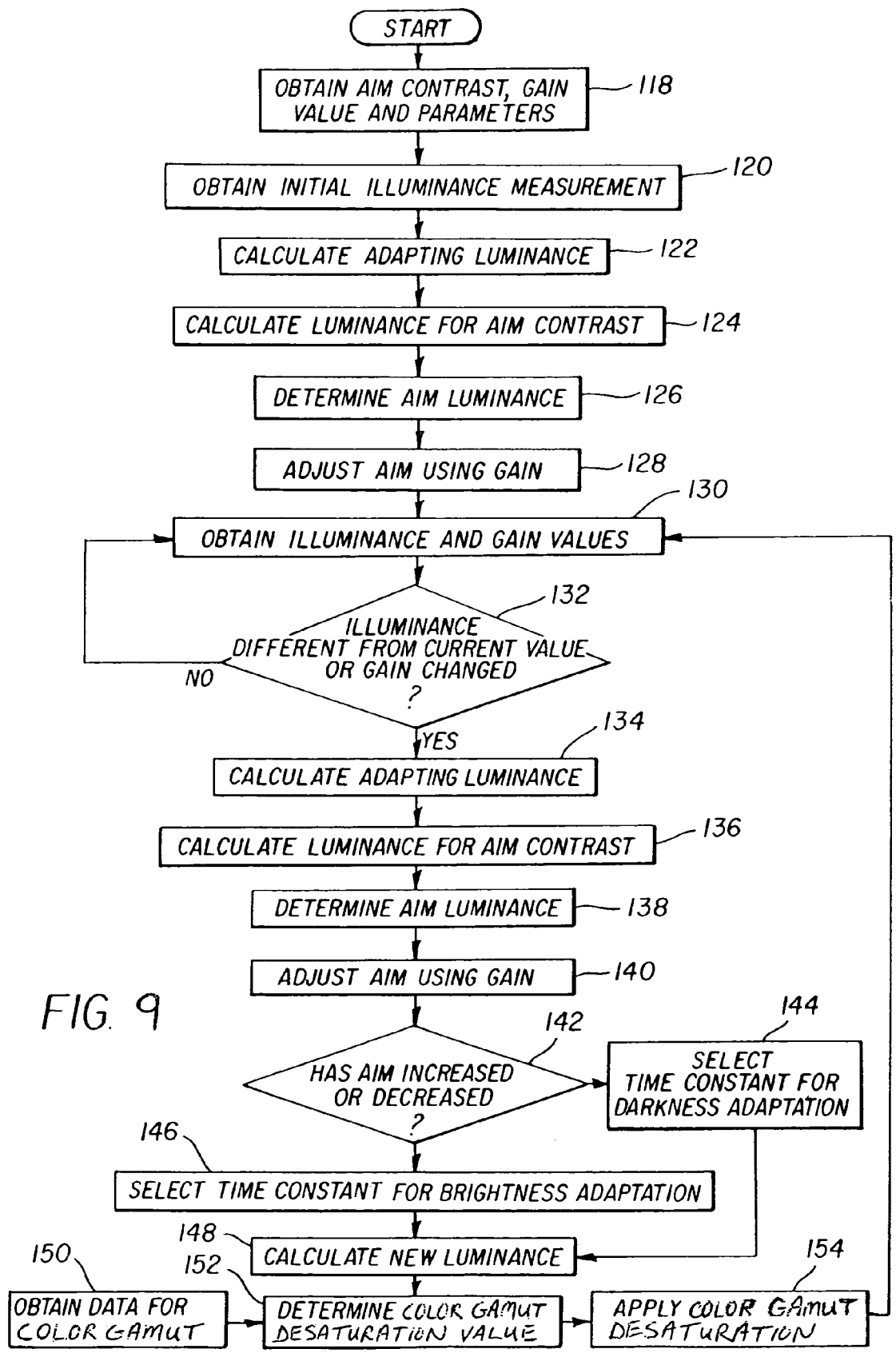

COLOR OLED DISPLAY SYSTEM HAVING IMPROVED PERFORMANCE

CROSS-REFERENCE TO RELATED APPLICATIONS

This is a continuation-in-part of U.S. Ser. No. 10/320,195, filed Dec. 16, 2002 now U.S. Pat. No. 7,230,594, and a continuation-in-part of U.S. Ser. No. 10/387,953, filed Mar. 13, 2003 now U.S. Pat. No. 7,184,067, the disclosures of which are incorporated by reference herein in their entireties.

FIELD OF THE INVENTION

The present invention relates to organic light emitting diode (OLED), full-color display devices and, more particularly, to OLED color displays with improved power efficiency or extended display lifetime.

BACKGROUND OF THE INVENTION

Color, digital image display devices are well known and are based upon a variety of technologies such as cathode ray tubes, liquid crystal and solid-state light emitters such as Organic Light Emitting Diodes (OLEDs). In a common OLED color display device a pixel includes red, green, and blue colored OLEDs. By combining the illumination from each of these three OLEDs in an additive color system, a full-color display having a wide variety of colors can be achieved.

OLEDs may be used to generate color directly using organic materials that are doped to emit energy in desired portions of the electromagnetic spectrum. However, the known red and blue emissive materials are not particularly power efficient. In fact, broad bandwidth (white appearing) materials are known that have power efficiencies that are high enough by comparison to narrow bandwidth materials to produce a comparably power efficient OLED display by placing color filters over a broad bandwidth emissive material. Therefore, it is known in the art to produce OLED displays by building a display using an array of white-emitting OLEDs and placing color filters over the OLEDs to achieve red, green and blue light emitting elements in each pixel.

While power efficiency is always desirable, it is particularly desirable in portable applications because an inefficient display limits the time the device can be used before the power source is recharged. In fact, for certain applications the rate of power consumption may be more important than any other display characteristic with the exception of visibility. For this reason, under certain circumstances the end user may wish to reduce the power consumption of a display by making tradeoffs in display performance, which may have the effect of reducing the visibility or perceived quality of the display under various conditions.

Portable applications may require the display to be used in locations with high ambient illumination. It is known in the art, that an emissive display must be capable of providing higher luminance levels to be seen under high ambient illumination conditions than under lower ambient illumination conditions, and it is also known that these higher luminance levels are necessary to produce both adequate luminance contrast as well as a luminance range that is near the adapted luminance range of the observer. See "The ABC's of Automatic Brightness Control", R. Merrifield and L. D. Silverstein, SID 88 Digest, 1988, pp. 178-180. For this reason, it is known to provide a user with a control to change the luminance of the display in response to changes in ambient illumination conditions. It is also known to automatically adjust the luminance of the display. For example, U.S. Pat. No. 3,813,686, issued May 28, 1974 to Mierzwinski, discusses a control circuit for a cathode ray tube that automatically increases the luminance and chrominance signals to produce a more appealing and useful image under high ambient viewing conditions.

In portable applications, such an automatic circuit allows the display to provide a lower luminance and thus reduced power consumption under low ambient illumination conditions and a higher luminance and thus improved visibility under high ambient illumination conditions. Many enhancements have been discussed for this basic method of adjusting the luminance of a display in response to changes in ambient illumination. For example, U.S. Pat. No. 6,411,306, issued Jun. 25, 2002 to Miller, et al., discusses a method of adjustment for a portable device in which the luminance and contrast of the display are modified in a way which is consistent with human adaptation, that is the luminance of the display is adjusted quickly and in a progressive fashion as the display is moved from a low to a high ambient illuminance environment but the luminance of the display device is adjusted more slowly as the display is moved from a high to a low ambient illuminance environment. However, any previous method that has been used to adjust the luminance of the display has required proportionally more power with increases in display luminance.

In a typical, prior-art OLED display, it is known that the luminance of the red, green, and blue OLEDs increase as current density delivered to the OLED is increased. The transfer function from current density to luminance typically behaves according to a linear function as shown in FIG. 1 as known in the prior art. FIG. 1 shows current density to luminance transfer functions for typical red 2, green 4 and blue 6 OLEDs. Therefore, to increase the luminance of the display, one must increase the current delivered to an OLED with a given area. To maintain a color-balanced display, the current must be adjusted differentially to the three OLEDs to maintain the desired ratio of red:green:blue luminance.

Unfortunately, increasing the current density used to drive an OLED not only increases the power required to drive the OLED but also reduces the lifetime of the OLED. FIG. 2 shows typical functions that describe the time required for an OLED to lose half of its luminance as a function of the current density used to drive the OLED. These functions describe the luminance stability over time of the OLEDs as a function of current density. FIG. 2 shows the luminance stability over time of a typical red 8, green 10 and blue 12 OLED. Therefore, increasing the luminance of an OLED display not only increases the power needed to drive the OLED display device but can significantly reduce the lifetime of the OLED display device.

The overall lifetime of a display may be decreased through changes in relative color efficiency as well as declining luminance output. If one OLED material used to produce a particular color of light degrades more rapidly than other materials that produce other colors of light, for example through heavier use, the particular light output from the material will decrease relative to the other colors of light. This differential color output change will change the color balance of the display and is much more noticeable than a decrease in overall luminance. While this decrease in luminance and light output of the particular color can be accommodated by increasing the brightness of the particular color, such a solution increases the rate of aging, the power usage, and exacerbates the change in relative color efficiency in the display.

There is, therefore, a need to improve power efficiency and/or improve display lifetime of an OLED. There is a further need for a full-color OLED display device having improved power efficiency and lifetime without necessarily decreasing the luminance of the display.

SUMMARY OF THE INVENTION

An OLED display system includes a) an OLED display including an array of light emitting pixels, each pixel having a plurality of OLEDs for emitting different colors of light specifying a gamut wherein one of the OLEDs has a power efficiency or lifetime different from the power efficiency or lifetime of at least one of the other OLEDs; b) a control signal; and c) a display driver for receiving a color display signal representing a relative luminance and color to be produced for each pixel of the display and generating a converted color display signal for driving the OLEDs in the display, wherein the display driver is responsive to the control signal for controlling the color gamut saturation of light produced by the OLEDs to reduce power consumption or increase lifetime of at least one of the OLEDs.

ADVANTAGES

The advantages of this invention include an OLED display system that allows improved power efficiency and display lifetime without necessarily decreasing the luminance of the display.

BRIEF DESCRIPTION OF THE DRAWINGS

FIG. 9 is a flow chart illustrating a method for determining subtraction and addition constants based upon a measurement of the ambient illuminance level.

DETAILED DESCRIPTION OF THE INVENTION

Figure 1:
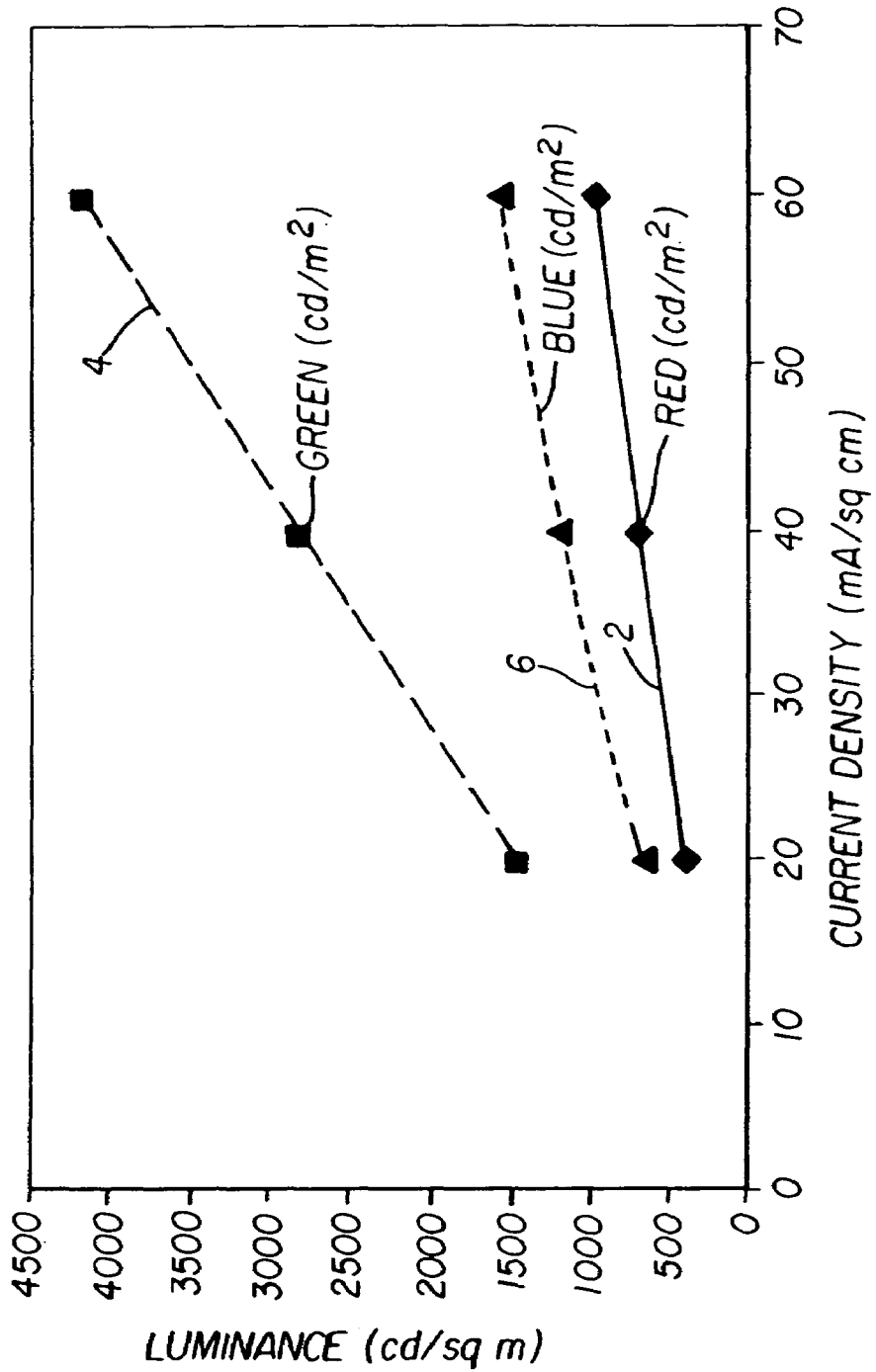
FIG. 1 is a graph showing the relationship of current density to luminance for a typical OLED.

The present invention is directed to a color OLED display system comprising a color OLED display, a control signal, and a controller for driving the color OLED display device in response to the control signal. More particularly, the present invention is directed to display systems that include a full-color display device having three or more emissive OLEDs, providing three or more primary colors that define the color gamut of the display device. The display system comprises an OLED display including an array of light emitting pixels, each pixel having a plurality of OLEDs for emitting different colors of light specifying a color gamut; a control signal; and a display driver for receiving a color display signal representing a relative luminance and color to be produced for each pixel of the display and generating a converted color display signal for driving the OLEDs in the display, the display driver being responsive to the control signal for controlling the color-gamut saturation such that the power efficiency of the display may be increased and/or the rate of degradation of the OLED display may be decreased. In this invention, the display driver associated with the display device includes a signal processor that converts a standard three-color image signal to drive signals that drive the emissive OLEDs in a way that is dependent on the control signal.

This conversion is accomplished such that the power usage is reduced or display lifetime improved by decreasing the color-gamut saturation in response to a control signal. The term "color-gamut saturation" refers to the purity of colors produced by the display device. More specifically, a display that is color-gamut saturated will display the purest colors of which it is capable when the input code values in a three-color signal are zero in one or two channels. A display displaying color-gamut desaturated colors produces colors that are not as pure as those of which it is capable: a color display that presents a black and white image when a three-color signal is input to the display is the extreme example of a color-gamut desaturated display.

The control signal will typically be dependent upon user settings, a state of the display system, the image content to be displayed, the power available to the display system, and/or a measurement of ambient illumination. When ambient illumination is sensed the display system may additionally adjust the luminance of the display to maintain display visibility under the appropriate ambient illumination conditions. By allowing the conversion to be dependent on user settings, the user is given the ability to trade color-gamut saturation for power efficiency. This conversion may additionally be dependent upon the luminance of the display. By allowing the conversion to be dependent on a control signal that is used to derive the target luminance value of the display, the conversion may provide fully, or nearly fully, color-gamut saturation for a broad range of luminance values. However, the display system may change the conversion to provide higher utilization of OLEDs with higher power efficiency and/or luminance stability over time for other luminance values. By doing this, conditions that may demand excessive power or may cause an unacceptable degradation of the display device may be avoided by providing color-gamut desaturation.

It is recognized that while the present invention is disclosed for a display system that employs a full-color OLED display device, this same technique may be applied to any full-color emissive display device having three or more emissive elements defining a color gamut for the display, providing that one of the emissive OLEDs is more efficient and/or has a higher luminance stability over time than at least one of the other emissive OLEDs. An additional emissive OLED may be employed to provide a color that is inside the gamut of the display device. Preferably, when employed, the in-gamut emissive OLED will have a higher power efficiency and/or luminance stability over time than one or more of the emissive OLEDs that define the gamut of the display device.

Figures 3, 4:
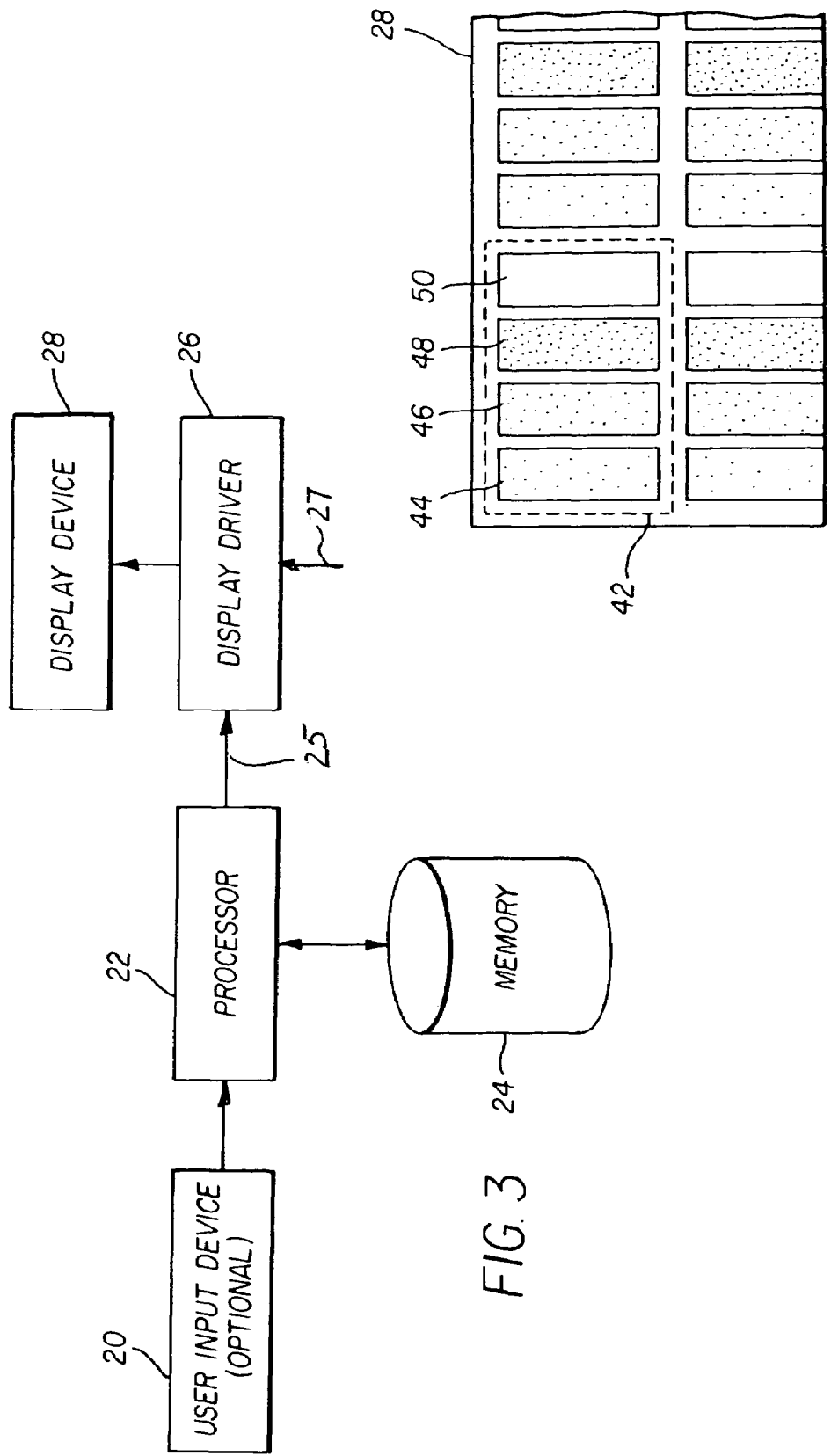
FIG. 3 is a diagram illustrating the components of the display system according to one embodiment of the present invention.
FIG. 4 is a schematic diagram illustrating the layout of a series of OLEDs on a display device according to one embodiment of the present invention.

An embodiment of this invention is shown in FIGS. 3 and 4. Referring to FIG. 3, the system includes an input device 20, processor 22, memory 24, display driver 26 and display device 28. The input device 20 may include any traditional input device including a joystick, trackball, mouse, rotating dial, switch, button or graphic user interface that may be used to select among two or more options from a series of user options. The processor 22 is any, or a combination of any, digital or analog, general-purpose or custom controller(s) capable of performing the logic and calculation steps necessary to perform the steps of this invention. The processor 22 may be any computing device suitable to an application and may, or may not, be combined into a single component with the display driver 26. The memory 24 ideally includes non-volatile, writable memory that can be used to store user selections including EPROMS, EEPROMS, memory cards, or magnetic or optical discs.

The display driver 26 is one or more analog or digital signal processors or controllers capable of receiving a standard three-or-more color image signal and converting this signal to a power-saving or lifetime-preserving drive signal compatible with the display device of the present invention. In the case of a display having more than three conventional colors, for example red, green, blue and white, the display driver 26 may also convert a traditional three-color signal to a four-color signal. This display driver is additionally capable of receiving a control signal 25 from the processor 22 or a control signal 27 from an external source (not shown) and adjusting the conversion process in response to this control signal. Either or both control signals 25 or 27 may be employed. The processor 22 may supply the control signal 25 in response to information regarding the age of the display, the charge of the power source, the content of the information to be displayed on the display 28, or the ambient illumination. Alternatively these signals may be supplied through an external control signal 27 from an ambient illumination sensor (for example a photosensor) or a device for measuring or recording the age of the display, or the charge of a power source.

The display device 28 is an OLED display device having an array of pixels, each pixel having OLEDs for providing three or more primary colors that define the gamut of the display device, wherein one of the OLEDs is more efficient than at least one of the other OLEDs. The OLED may include one or more additional OLEDs emitting a color that is inside the gamut of the display device, preferably having a higher power efficiency than the OLEDs that describe the gamut of the display device. An appropriate OLED display device has been discussed in a co-pending application, U.S. Ser. No. 10/320, 195 filed Dec. 16, 2002 by Miller, et al., which is incorporated herein by reference. A display device with such a pixel arrangement is shown in FIG. 4.

Figure 5:
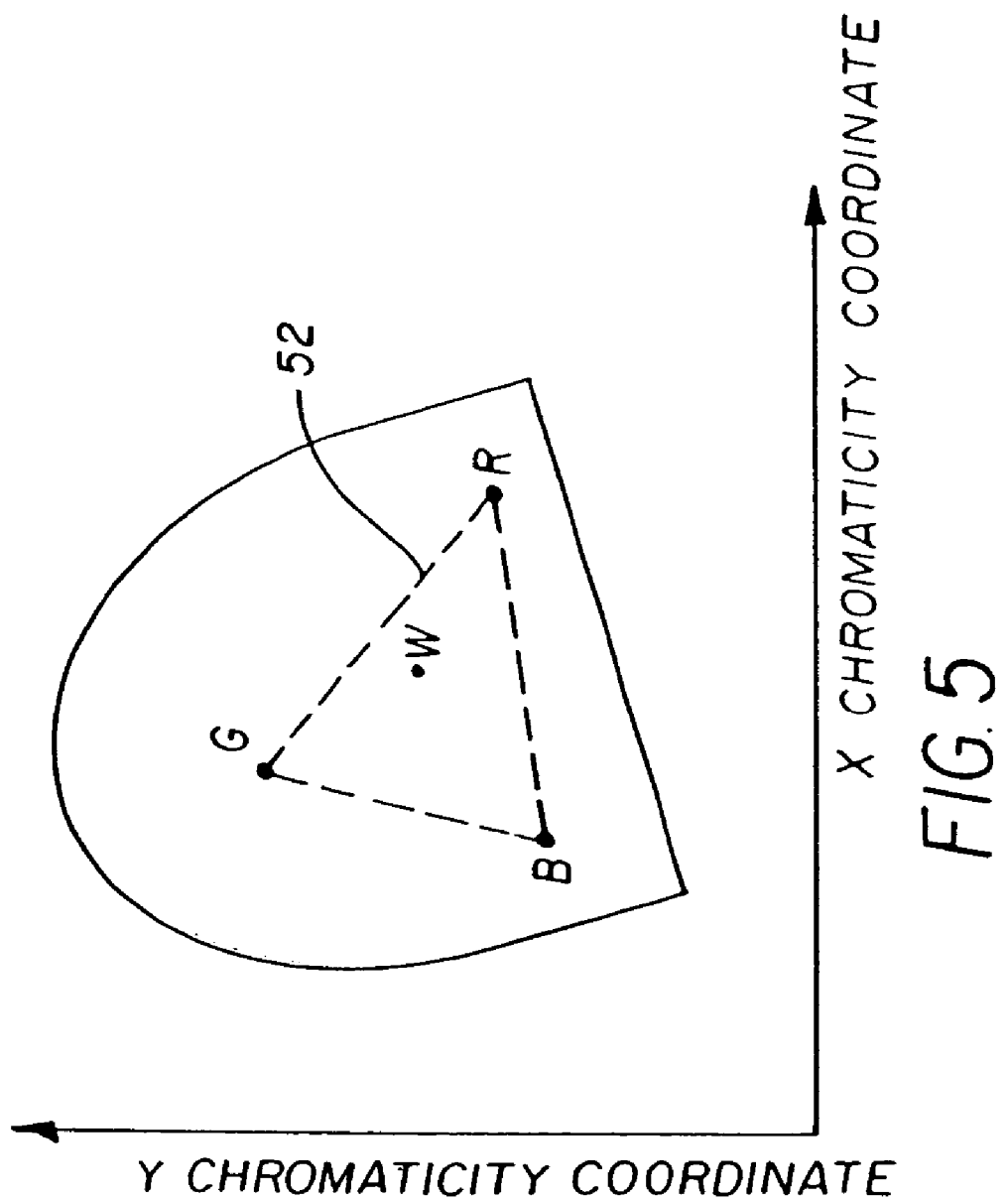
FIG. 5 is a CIE chromaticity diagram showing gamut formed chromaticity coordinates of red, green and blue OLEDs and a chromaticity coordinate of a white OLED inside the gamut.

FIG. 4 shows a display device 28, that is composed of a number of pixels 42. Each pixel 42 in this display device 28 is composed of four OLEDs. Three OLEDs that emit red 44, green 46, and blue 48 light define the gamut of the display device. An additional OLED 50 emits light that is substantially white in color and has a chromaticity coordinate that is inside the gamut defined by the chromaticity coordinates of the red 44, green 46 and blue 48 OLEDs. FIG. 5 is a standard CIE chromaticity diagram showing a color gamut 52 formed by the chromaticity coordinates of the red, green and blue (R,G,B) OLEDs and the chromaticity coordinate of a white (W) OLED that is inside the gamut 52.

In operation a three-color OLED (for example red, green, and blue) having one color, for example green, that is more efficient than the red or blue color light emitters, may reduce the color-differential aging of an OLED display by providing a desaturated color gamut as follows. For example, assume an OLED display driven at 10 volts and 20 mA/cm² (200 mW) produces a light output from the green light emitter of 120 cd/m², a light output from the red light emitter of 60 cd/m², and a light output from the blue light emitter of 40 cd/m²; the display can produce 360 cd/m² using 1.2 W to emit a white light at a white point requiring an equal brightness contributions from every emitter. (In this example, a normalized device size of 1 cm² is used.) A green color of equivalent brightness would require 0.6 W, a red color of equivalent brightness would require 1.2 W, and a blue color of equivalent brightness would require 1.8 W. At the extreme limits of the color gamut, therefore, this display would require between 0.6 W and 1.8 W to emit 360 cd/m². The current density of the red light emitters will be twice that of the green light emitters, and the current density of the blue light emitters will be three times that of the green light emitters.

If the color gamut is desaturated so that the extreme limits of the color gamut are less pure, the overall power usage may remain the same but the maximum current density is reduced. For example, if the color gamut is reduced so that half of the light is white and all three color emitters are employed for all emitted colors, a desaturated color gamut green light would require 0.9 W instead of 0.6 W (an increase), a desaturated color gamut red would still require 1.2 W (no change), and a desaturated color gamut blue would require 1.5 W instead of 1.8 W (a decrease). This may, or may not result in an overall decrease in power usage depending on the content displayed on the display.

However, the maximum current density in any emitter has been reduced. In the saturated color gamut example, green was at 60 mA, red at 120 mA, and blue at 180 mA to produce saturated colors at 360 cd/m². In the desaturated color gamut example, to produce colors at 360 cd/m² required 90 mA for green, 120 mA for red, and 150 mA for blue. In the desaturated color gamut example, the reduced current for the saturated colors is made up by an increase in the other colors. The range of currents in the saturated gamut example is from 60 mA to 180 mA while the range of currents in the desaturated example is from 90 mA to 150 mA, a significant reduction in current density differences, thereby reducing differential color aging and preserving display lifetime.

Referring to FIG. 5, a three-color OLED (for example red, green, and blue) may employ an additional in-gamut emitter, for example a relatively more efficient white emitter. Such an OLED may save power by providing a desaturated color-gamut as follows. For example, assume an OLED display driven at 10 volts and 20 mA (200 mW) produces a light output from the white light emitter of 180 cd/m², a light output from the green light emitter of 120 cd/m², a light output from the red light emitter of 60 cd/m², and a light output from the blue light emitter of 40 cd/m². In this example, there is an indefinite number of ways to produce a white color by combining the color elements with the white emitter. For example, the color white can be produced by using the white emitter alone without any contribution from the color emitters. Alternatively, the color white can be produced from a combination of the color emitters without any contribution from the white emitter. Methods of computing a conversion from a red, green, and blue color signal to a red, green, blue, and white signal are described in copending application U.S. Ser. No. 10/607,374 by Murdoch et al., which is hereby incorporated by reference.

In this example, a color-gamut saturated green color of 360 cd/m² may be produced using 0.6 W, a color-gamut saturated red color of 360 cd/m² may be produced using 1.2 W, and a color-gamut saturated blue color of 360 cd/m² may be produced using 1.8 W. In contrast, by using the white light emitter, a color-gamut desaturated green color may be produced by using the white light emitter to produce half the light, as in the first example. The power required to produce the color-gamut desaturated green light is 0.5 W; the power required to produce the color-gamut desaturated red light is 0.8 W; the power required to produce the color-gamut desaturated blue light is 1.1 W. In every case, less power is used because the more efficient white light emitter is used to provide half of the light. In this case, it is also true that the overall current density is decreased as well, since the current used is decreased. Hence, the present invention as applied to the four-color OLED pixel will provide both reduced power consumption and reduced differential color aging.

A three-color OLED (for example red, green, and blue) may also employ an additional OLED emitter which emits light outside of the gamut defined by the first three colors, for example a more efficient yellow or cyan emitter (relative to the first three colors). Use of such additional gamut-expanding emitters are described, e.g., in U.S. Pat. 6,570,584. Such an OLED may save power by providing a desaturated color-gamut by employing the additional emitter to provide light more efficiently than with the red, green, or blue emitters. In this case, while the additional OLED emitter will expand the overall color gamut, by using the additional emitter in place of at least one of the other colors, the color gamut may be desaturated in accordance with the invention. For example, an efficient yellow can be used to replace green or red, thereby desaturating the green or red color gamut. In this example, as with an in-gamut emitter, there are an indefinite number of ways to produce a white color by combining the color elements with the additional emitter. For example, the color white may be produced by using a yellow emitter in combination with blue and green emitters, or in combination with blue and red emitters, depending upon the white point of the display. Alternatively, the color white may be produced from a combination of the red, green and blue emitters without any contribution from the additional emitter.

In practical use, if a display is to maintain a given resolution, it is possible that the use of a four-color pixel may reduce the actual light emitting area of the individual elements. While this will not change the total power used to produce a given brightness, it can increase the current density and decrease the display lifetime. Therefore, for any specific application it is important to compare any changes in the emissive area of a pixel to the changes in power usage to optimize the display lifetime and power usage.

The present invention describes a way to reduce power usage and improve lifetime for a display by employing a desaturated color gamut. However, a desaturated color gamut in a display may reduce the perceived image quality of a display. Hence, it is important to apply the present invention in applications where a desaturated color gamut does not significantly reduce the perceived image quality of the display or in situations where any decrease in perceived image quality is outweighed by the advantages gained in power usage or improved lifetime of the display. For example, the applicants have demonstrated through tests that the loss in perceived image quality of a desaturated color gamut display under high ambient light conditions is minimal and much less than the perceived image quality loss of the display under low ambient light conditions. Hence, the present invention may be applied to provide reduced power under bright ambient conditions without compromising either display brightness or perceived image quality.

Referring back to FIG. 3, a variety of sources for the control signal may be employed. One such control signal may be produced by a signal representing the ambient illumination. In operation, the display driver 26 or processor 22 may respond to a signal representing the level of light in the ambient illumination. Under bright conditions, the color-gamut saturation of the display is reduced. Under dim conditions, the color-gamut saturation of the display is maintained at the maximum color-gamut saturation. Preferably, the transition from color-gamut saturation to desaturation is accomplished gradually as the ambient light illumination increases so that any changes are imperceptible to a viewer. It is possible to limit the color-gamut desaturation to some maximum value to avoid causing a display to become completely monochrome under very bright conditions. Alternatively, in some circumstances, a minimum value may be employed. It is also possible to provide a function, for example a linear or exponential function relating the color-gamut saturation and the ambient illumination to determine the color-gamut saturation desired at a particular ambient illumination level. Such functions may have limits, or damping constants, to limit the rate of change of the color-gamut saturation to reduce the perceptibility of any color-gamut saturation changes.

In an alternative embodiment, it is possible to use the state of the power supply to dictate the color-gamut saturation. In a situation where the power supply is depleted, aggressive power saving measures may be employed to reduce power usage. In this case, the color gamut may be desaturated. When the power supply is fully charged, the color gamut may be saturated. As before, a gradual decrease in color-gamut saturation may be employed to avoid perceptible changes over time.

In another alternative embodiment, it is possible to use the information shown on a display to dictate the color-gamut saturation. In a situation where a graphic interface is employed on a display, saturated colors may not be necessary to communicate information to a user. In this case, the color gamut may be desaturated. If images are shown on a display, the use of a fully-saturated color gamut may be preferable. Hence, power may be saved when employing a graphic interface. However, it is also the case that graphic interfaces tend to use graphic elements for long times at specific locations, possibly causing the light-emissive materials at those display locations to degrade more rapidly than in other locations. The present invention may be employed to reduce both the current and the range of current densities in those locations. Therefore, the rate of degradation of the emissive materials and color differential degradation may be reduced. This will reduce the effect of image persistence or burn-in for a display.

In yet another alternative embodiment, it is possible to use the age of the display to dictate the color-gamut saturation. Typical OLED materials in use today degrade most rapidly when they are first used. After some period of time, the rate of degradation is reduced. In this situation, it may be helpful to reduce color differential aging at the beginning of the display lifetime by employing the present invention. After some period of time, the level of color-gamut desaturation may be reduced. As before, a gradual change in color-gamut saturation may be employed to avoid perceptible changes over time.

In is also possible to allow a display user to directly control the color-gamut saturation through a user interface. More likely, a power control mechanism may be employed by the user and the present invention may be employed along with other power saving measures such as display brightness, to reduce power usage or improve display lifetime at the user's discretion. The user can then make tradeoffs between system attributes such as power usage, display visibility, and image quality.

Although a variety of embodiments employing the present invention are described herein, it is understood that other applications may require improved lifetime or reduced power usage for a display. Hence, the application of the present invention is not limited to the embodiments described herein.

Figure 6:
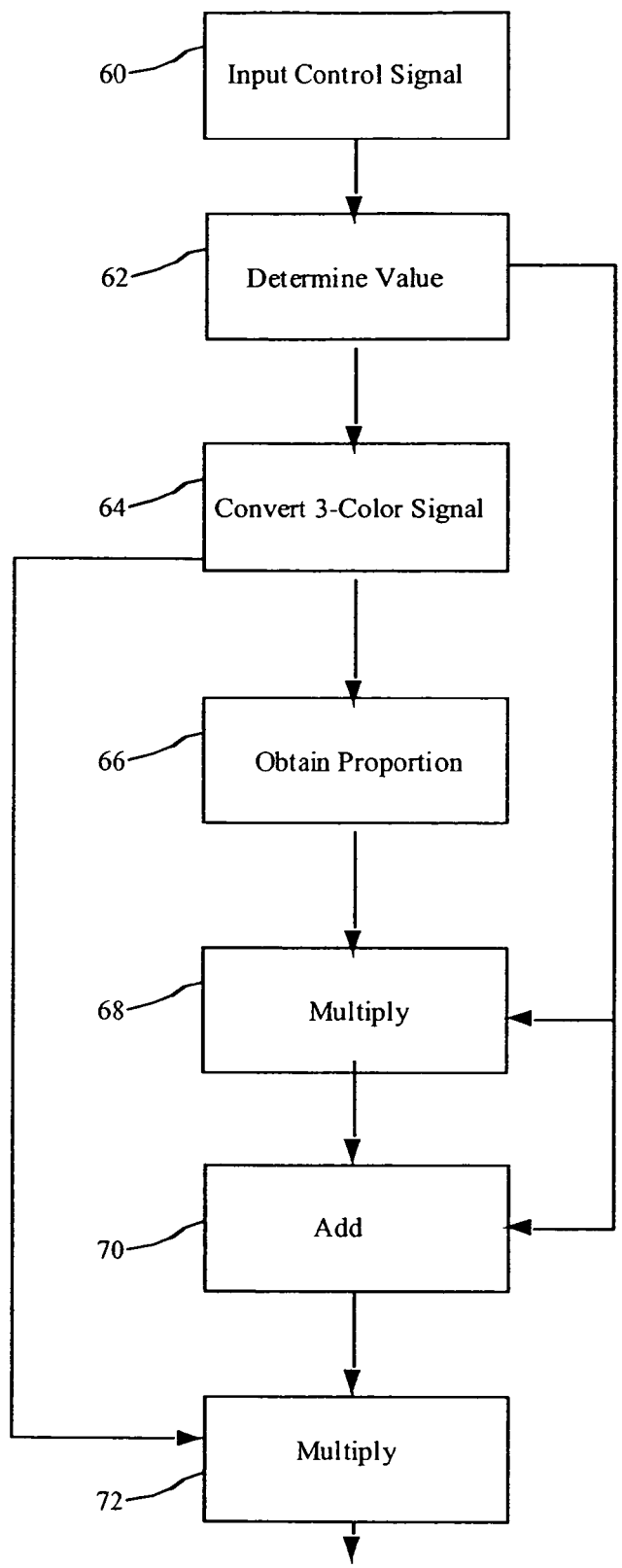
FIG. 6 is a flow chart illustrating the general process employed by the system to determine an appropriate subtraction and addition constants.

FIG. 6 shows a process that may be employed to practice this invention. A control signal that corresponds to a given level of color gamut desaturation is input 60. Based upon this control signal, an appropriate color gamut desaturation value (ranging from zero to one, with one corresponding to a monochrome image and zero indicating no change) is determined 62. The three-color input signal is then converted 64 to linear intensity wherein the linear intensity of a primary is herein defined as a value proportional to the luminance of that primary and scaled such that the combination of unit intensity of each of the three primaries produces a color stimulus having XYZ tristimulus values equal to those of the display white point. Additionally, the proportion of the luminance of each of the three channels used to create white are obtained 66. A matrix to convert from one level of saturation to another is determined by multiplying 68 the color gamut desaturation value by the proportions that were obtained in step 66 and adding 70 the resulting values to 1 minus the color gamut desaturation value. The desaturated linear intensity values are then determined by multiplying 72 the matrix by the linear intensity values. The resulting desaturated linear intensity values may then be supplied to the three-to-four color conversion process as described by Murdoch et al. or converted to drive values for a typical three-color display.

Figure 2:
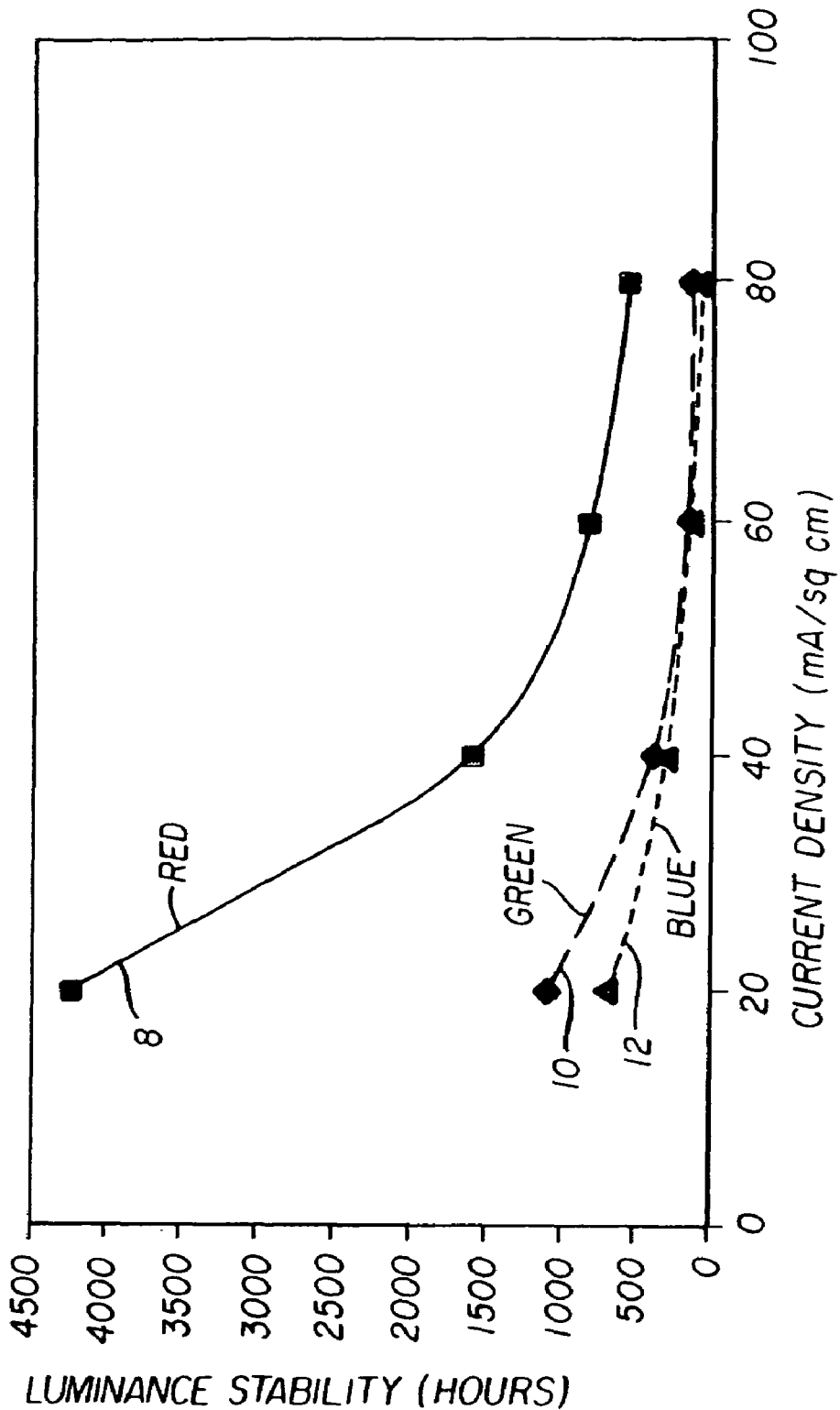
FIG. 2 is a graph showing the relationship of current density to the luminance stability over time of a typical OLED.

It should also be noted that this conversion process may be further modified to not only reduce power but to help maintain display lifetime. As shown in FIG. 2, OLED luminance stability, when defined as the number of hours required for an OLED to reach half of its initial luminance, is highly dependent upon the drive current. Therefore, if it is determined that the display must perform for a minimum number of hours, e.g., 500, one can use a graph such as FIG. 2 to determine the maximum current density that the OLED can be driven to meet this criteria. Using this criteria, one can see that the blue light emitting OLED can only be driven at a current density of 20 mA/sq. cm while the green and red light emitting OLEDs can be driven at current densities around 35 and 80 mA/sq. cm, respectively. White emitting materials are known that perform very well using this criteria and can be driven at or even well beyond 80 mA/sq. cm using this criteria. Using this value and a mathematical relationship relating current density to luminance of a display device, one can determine the maximum luminance and the corresponding maximum linear intensity value that can be achieved for any color light emitting OLED that will not exceed the maximum current density for the appropriate OLED. Therefore, the maximum intensity may be limited and any additional light may be transferred to the neutral channel to be provided by the white-light emitting OLED. In this way, the color-gamut saturation may be reduced for that one color. It should be noted that it is possible that the luminance required from the white-light emitting OLED may also reach a maximum value in which case this luminance may be redistributed to the color light emitting OLEDs using a similar approach.

By providing a conversion process, the user is able to modify the power usage of the display for a given display brightness by allocating the amount of luminance to be generated by the display away from less power efficient OLEDs and towards more power efficient OLEDs. Therefore, this invention allows the user to trade power efficiency for color gamut saturation.

Figure 7:
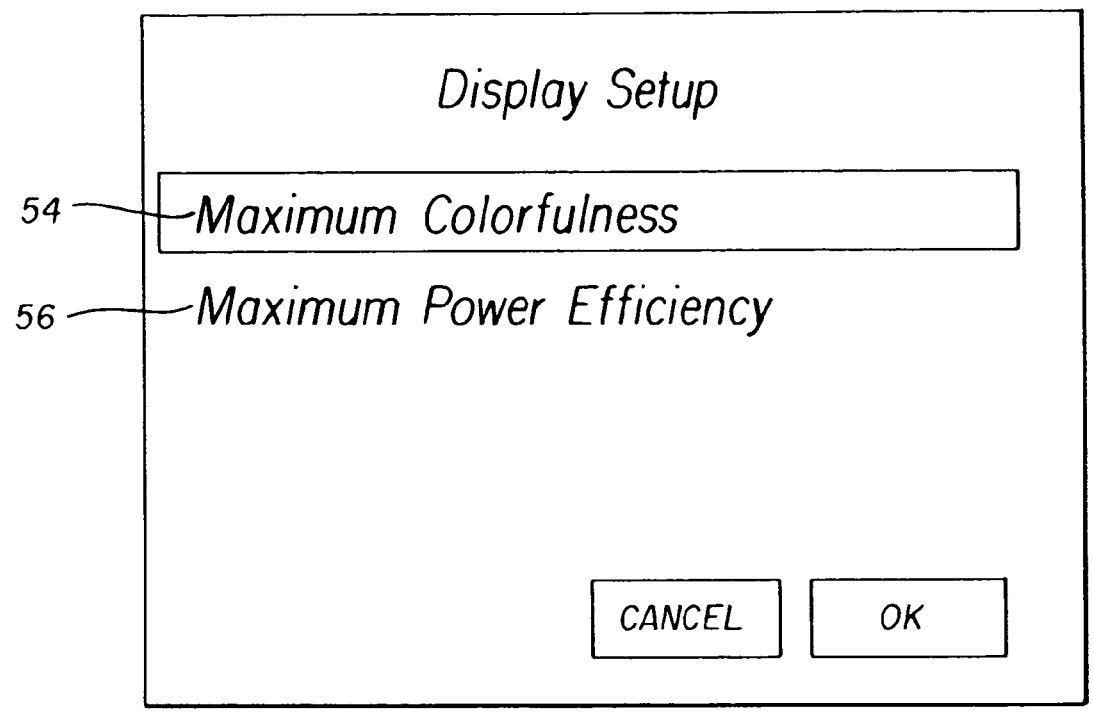
FIG. 7 is a diagram illustrating a graphic user interface screen for obtaining user input.

It should be noted that the tradeoff of power efficiency for color-gamut saturation may be made intentionally by the user. To accomplish this, a menu of possible alternatives may be displayed to the user as shown in FIG. 7. The alternatives can include, for example, "maximum readability" 54 reducing the white mixing ratio, or "maximum power efficiency" 56 allowing the maximum use of the white OLEDs. Alternatively, a "slider" can be provided in the graphic user interface to allow the user to select a continuous level of trade off between image quality and power usage. However, as noted above, the same tradeoff may be initiated by other events. For example, the user interface may provide a control, such as a brightness control for the display. Alternatively, a system may be able to detect the power level of a battery, such that the display draws less power when the available battery power level reaches some threshold. The same tradeoff may further be made when the system detects lack of user interest or responsiveness. For example when a certain amount of time passes without user interaction, the system may begin to enter a power saving mode.

Figure 8:
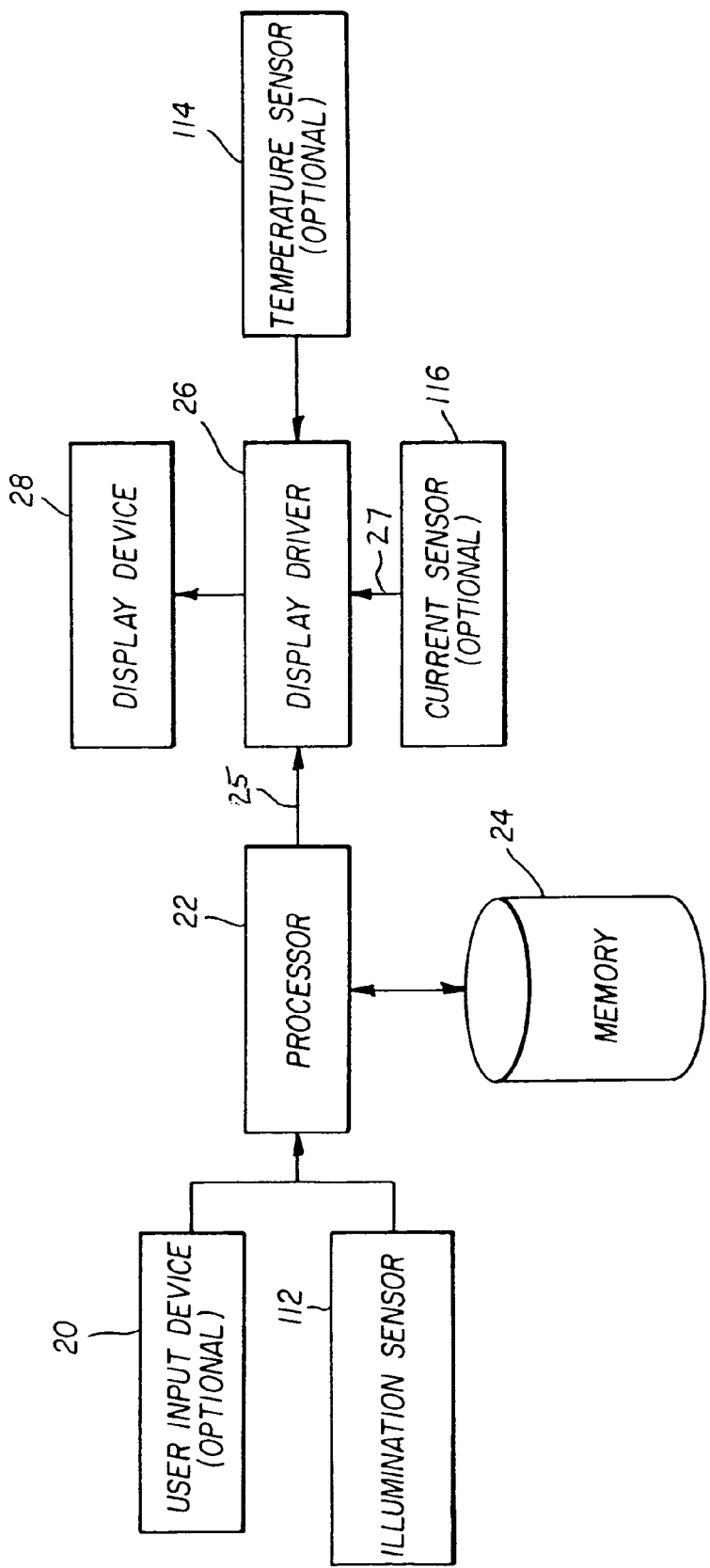
FIG. 8 is a diagram illustrating the components of the display system according to one embodiment of the present invention.

Referring to FIG. 8, the display system of the present invention may employ an automatic method for determining ambient illumination, adjusting the brightness of the display in response, and adjusting the color gamut saturation in response to the ambient illumination in a way that makes the loss of saturation appear at a slow enough rate that the change is not readily apparent to the user, while at the same time improving the power efficiency of the display device and/or improving the lifetime of the display under high display luminance conditions. As shown in FIG. 8, the display system includes a processor 22, memory 24, display driver 26 and a display device 28. The system also includes a user input device 20, which is used to adjust a gain value for the display brightness as described below. Additionally the system may include an ambient illumination sensor 112 such as a photodiode or other sensor that is used to measure the amount of ambient illuminance in the environment that falls on or near the display. As discussed later, the system may also include other sensors, such as an optional temperature sensor 114 or current sensor 116. The temperature sensor 114 may be placed on the back of the display and is used to measure the temperature of the display device. Temperature is another input that could be used to signal the need for reduced color gamut to reduce power consumption and extend the life of the OLED. It is known that the life of an OLED is reduced at higher temperatures and therefore reducing color gamut could offset the reduced OLED life at higher temperatures. OLEDs also tend to consume more power at higher temperatures, further increasing the value of using temperature as an input and reducing color gamut and display luminance as the temperature of the OLED increases. The current sensor 116 may be used to measure the current being drawn by the display device.

A method which may be used to adjust the color gamut saturation within this system is shown in FIG. 9. As shown in FIG. 9, on power up, aim contrast, gain values and additional parameters are obtained 118. An initial ambient illuminance is then measured 120 using the ambient illumination sensor 112. The adapting luminance is then calculated 122 for the current ambient illumination level. This calculation is used to determine the minimum brightness that is required for the display to be viewed given the adaptation state of the user. This calculation is performed using the equation:

$$L_a = 10^{(a+b\,\log(I))} \quad (4)$$

Where $L_a$ is the adapting luminance, I is the ambient illuminance value and a and b are constants that are fit to psychophysical data.

Once the adapting luminance is calculated 122, the luminance required to obtain the aim display contrast is calculated 124. This calculation is performed to account for the fact that the ambient illuminance is reflected from the display, affecting the luminance of the background and foreground luminance. This value is calculated from the equation:

$$L_c = cL_b + (c-1)\left(\frac{IR}{\pi}\right) \quad (5)$$

where $L_c$ represents the luminance required to achieve the desired contrast, c represents the desired contrast ratio of the white to the black luminance (typically a value greater than 3), $L_b$ represents the minimum emitted display luminance (typically 0 for an OLED display device), I is the ambient illuminance, R is the reflectance of the display, and $\pi$ is the constant pi.

The initial aim luminance is determined 126 by taking the maximum of the adapting luminance, the luminance required to obtain the aim display contrast and any minimum luminance constraint that may exist in the parameter set obtained 118 earlier. The gain value, which is typically a value between 0.5 and 2.0, is then used to adjust 128 the initial aim luminance value through multiplication.

New ambient illuminance and gain values are obtained 130 by obtaining an ambient illuminance measurement from the ambient illumination sensor 112 and by determining any change in the gain value from any change in the state of the user input device 20. These new values are compared 132 to the initial values. If no change has taken place, new readings of ambient illuminance and gain are obtained 130 and compared 132 again. If a change in ambient illuminance or gain occurs, the adapting luminance is calculated 134 using the new ambient illuminance value and the same equations used to calculate 122 the initial adapting luminance. A new luminance needed to obtain the necessary contrast is calculated 136 using the same equations as described for step 124. A new aim luminance is determined 138 using the same calculation described for step 126. Finally this value is adjusted 140 by the new gain value as described for step 128.

A step 142 is then performed to determine if the aim luminance has increased or decreased. If the aim luminance has decreased, a time constant is selected 144 that is appropriate for dark adaptation, otherwise a time constant is selected 146 that is appropriate for light adaptation. It should be noted that since human light adaptation occurs much more quickly than dark adaptation, the time constant for light adaptation is typically higher than for dark adaptation.

The new luminance is then calculated 148 and stored as the new initial luminance. This calculation 148 is performed by adding a proportion of the change in luminance to the current luminance using an equation of the form:

$$L = L_i + \frac{La - Li}{t} \quad (6)$$

where L is the new luminance, $L_i$ is the initial luminance, $L_a$ is the adjusted aim luminance calculated 140 earlier, and t is the time constant selected in step 144 or 146 above.

A formula or look-up table for determining color gamut desaturation as a function of display luminance values are then obtained 150, the color gamut desaturation value corresponding the aim luminance value is determined 152 and applied 154 within the conversion process. Using this process, the color gamut desaturation values can be changed gradually as the luminance of the display is adapted to the viewing environment. Since the occurrence of dramatic changes in ambient illumination are rare and the rate at which the brightness of the display is changed is slowed by the time constants that are employed, it is unlikely that the individual changes in color gamut saturation will be large using this process. Therefore, while the display will gain and lose color gamut saturation, especially when moved between very low ambient illuminance and very high ambient illuminance environments, it is unlikely that the user will see this change. However, since the color gamut desaturation value will generally be increased with increases in display luminance, the power efficiency and lifetime of the OLEDs that compose the display will be improved.

It should be noted that similar continuous changes in color gamut saturation may be employed as a function of any other continuous control signal. These may include but are not limited to the available power in the power supply of the portable device, a manually determined display luminance value, the total current needed to drive the display device as sensed using the optional current sensor 116 or the temperature of the display device determined from a temperature sensor 118 placed in or near the display device.

It should be noted that while particular embodiments discussed herein are discussed particularly for a display device having three OLEDs that define the gamut boundary of the display and one additional OLED that has a higher-power efficiency and lifetime and which has color coordinates that are within the gamut of the display device, these same concepts may be employed in a similar display device having more than three OLEDs that define the gamut. Additionally, these same concepts may apply to a display device having more than one additional OLED with a higher-power efficiency.

The present invention may be employed in OLED display having different materials to emit different colors of light. Alternatively, the present invention may be employed with OLED displays having a single emitter for emitting a broadband light (for example, white) and color filters to produce the different colors of light. In this latter case, the present invention will only provide improved power savings in a display device employing only three gamut defining OLEDs if the color filters are differentially efficient but may, in any case, be employed to reduce color differential aging in a display.

The present invention can be employed in most top-or bottom-emitting OLED device configurations. These include simple structures comprising a separate anode and cathode per OLED and more complex structures, such as passive matrix displays having orthogonal arrays of anodes and cathodes to form pixels, and active matrix displays where each pixel is controlled independently, for example, with a thin film transistor (TFT). As is well known in the art, OLED devices and light emitting layers include multiple organic layers, including hole and electron transporting and injecting layers, and emissive layers. Such configurations are included within this invention.

In a preferred embodiment, the invention is employed in a device that includes Organic Light Emitting Diodes (OLEDs) which are composed of small molecule or polymeric OLEDs as disclosed in but not limited to U.S. Pat. No. 4,769,292, issued Sep. 6, 1988 to Tang et al. and U.S. Pat. No. 5,061,569, issued Oct. 29, 1991 to VanSlyke et. al. Many combinations and variations of organic light emitting displays can be used to fabricate such a device.

The invention has been described in detail with particular reference to certain preferred embodiments thereof, but it will be understood that variations and modifications can be effected within the spirit and scope of the invention.

PARTS LIST 2 luminance transfer function for red OLED
4 luminance transfer function for green OLED
6 luminance transfer function for blue OLED
8 stability curve for red OLED
10 stability curve for green OLED
12 stability curve for blue OLED
20 input device
22 processor
24 memory
25 signal
26 display driver
27 signal
28 display device
42 pixel
44 red OLED
46 green OLED
48 blue OLED
50 white OLED
52 color gamut
54 maximum colorfulness selection
56 maximum power efficiency selection
60 input control signal step
62 determine value step
64 convert three-color step
66 obtain proportion step
68 Multiply step
70 add step
72 multiply step
112 ambient illumination sensor
114 temperature sensor
116 current sensor
118 obtain parameters step
120 measure ambient illuminance step
122 calculate adapting illuminance step
124 calculate luminance step
126 determine aim luminance step
128 adjust gain value step
130 obtain new values step
132 compare new values step
134 calculate adapting luminance step
136 calculate new luminance step
138 determine new aim luminance step
140 adjust luminance value step
142 determine increase or decrease step
144 select dark adaptation time constant step
146 select light adaptation time constant step
148 calculate new luminance step
150 obtain data for color-gamut saturation step
152 determine color-gamut saturation step
154 apply color-gamut saturation step

What is claimed is:

1. An OLED display system, comprising:
   a) an OLED display including an array of light emitting pixels, each pixel having a plurality of OLEDs for emitting different colors of light specifying a gamut wherein one of the OLEDs has a power efficiency or lifetime different from the power efficiency or lifetime of at least one of the other OLEDs;
   b) a control signal; and
   c) a display driver for receiving a color display signal representing a relative luminance and color to be produced for each pixel of the display and generating a converted color display signal for driving the OLEDs in the display, wherein the display driver is responsive to the control signal for controlling the color gamut saturation of light produced by the OLEDs to reduce power consumption or increase lifetime of at least one of the OLEDs, and wherein the color gamut saturation is controlled to limit color-gamut desaturation in the converted color display signal to a maximum value that avoids causing the display to become driven by a completely monochrome display signal.

2. The OLED display system claimed in claim 1, wherein the control signal is generated by a photosensor responsive to ambient illumination.

3. The OLED display system claimed in claim 2, wherein the display driver further changes the brightness of the OLED display in response to the ambient illumination level.

4. The OLED display system claimed in claim 1, wherein the control signal is dependent upon the image content of the color display signal.

5. The OLED display system claimed in claim 1, wherein the control signal is dependent upon the age of the OLED display.

6. The OLED display system claimed in claim 1, further comprising a portable power source for providing power to the OLED display, and wherein the control signal is dependent upon the power remaining in the portable power source.

7. The OLED display system claimed in claim 1, wherein the display driver includes a damping constant to prevent rapid changes in color gamut saturation of the OLED display.

8. The OLED display system claimed in claim 1, wherein the display driver changes the color gamut saturation of the OLED display in response to the OLED temperature.

9. The OLED display system claimed in claim 1, wherein the means for generating a control signal is a user interface control that allows a user to select a tradeoff between power usage and color gamut saturation of the OLED display.

10. The OLED display system claimed in claim 1, wherein the OLED display includes OLEDs having different emissive materials that emit different colors of light.

11. The OLED display system claimed in claim 1, wherein the OLED display includes OLEDs that employ a common emissive material that emits a broad spectrum of light and are overlaid with color filters.

12. The OLED display system claimed in claim 11, wherein the color filters include red, green, and blue.

13. The OLED display system claimed in claim 1, wherein the plurality of OLEDs includes at least one OLED within the gamut defined by the other OLEDs.

14. The OLED display system claimed in claim 13, wherein the in-gamut OLED emits white light.

15. The OLED display system claimed in claim 1, wherein the plurality of OLEDs includes at least one OLED outside the gamut defined by the other OLEDs.

16. The OLED display system claimed in claim 15, wherein at least one of the OLEDs emits yellow light.

17. The OLED display system claimed in claim 15, wherein at least one of the OLEDs emits cyan light.

18. The OLED display system claimed in claim 15, wherein the plurality of OLEDs includes at least one red, at least one green and at least one blue light emitting OLED, and at least one OLED outside the gamut defined by the red, green and blue light emitting OLEDs which has a power efficiency higher than the power efficiency of at least one of the other OLEDs.

19. The OLED display system claimed in claim 15, wherein reduced color gamut saturation of the OLED display is accomplished by increasing the relative brightness of the out-of-gamut OLED.

20. The OLED display system claimed in claim 1, wherein one of the OLEDs has a power efficiency greater than the power efficiency of at least one of the other OLEDs, and the display driver is responsive to the control signal for controlling the color gamut saturation of light produced by the OLEDs to reduce power consumption.

21. The OLED display system claimed in claim 1, wherein one of the OLEDs has a lifetime longer than the lifetime of at least one of the other OLEDs, and the display driver is responsive to the control signal for controlling the color gamut saturation of light produced by the OLEDs to increase lifetime of at least one of the other OLEDs.

22. The OLED display system claimed in claim 1, wherein the control signal is generated by a sensor responsive to OLED temperature, and wherein the display driver controls the color-gamut saturation of the converted color display signal in proportion to the OLED temperature.

23. A method of driving an OLED display, comprising the steps of:
   a) providing an OLED display including an array of light emitting pixels, each pixel having a plurality of OLEDs for emitting different colors of light specifying a gamut wherein one of the OLEDs has a power efficiency or lifetime different from the power efficiency or lifetime of at least one of the other OLEDs;
   b) generating a control signal;
   c) receiving a color display signal representing a relative luminance and color to be produced for each pixel of the display;
   d) generating a convened color display signal for controlling the color gamut saturation of light produced by the OLEDs; and
   e) driving the OLED display with the converted color display signal to reduce power consumption or increase lifetime of at least one of the OLEDs wherein the color gamut saturation is controlled to limit color-gamut desaturation in the converted color display signal to a maximum value that avoids causing the display to become driven by a completely monochrome display signal.

24. The method claimed in claim 23, further comprising changing the brightness of the OLED display in response to the ambient illumination level.

* * * * *

UNITED STATES PATENT AND TRADEMARK OFFICE
CERTIFICATE OF CORRECTION

| | | |
|---|---|---|
| PATENT NO. | : 7,397,485 B2 | Page 1 of 1 |
| APPLICATION NO. | : 10/812629 | |
| DATED | : July 8, 2008 | |
| INVENTOR(S) | : Michael E. Miller et al. | |

It is certified that error appears in the above-identified patent and that said Letters Patent is hereby corrected as shown below:

Column 16, line 7      "convened" should be replaced with --converted--

Column 16, line 12     "OLEDs" should be replaced with --OLEDs,--

Signed and Sealed this

Twenty-third Day of December, 2008

JON W. DUDAS
*Director of the United States Patent and Trademark Office*